(12) United States Patent
Fang et al.

(10) Patent No.: US 6,271,544 B1
(45) Date of Patent: *Aug. 7, 2001

(54) SIC/SI HETEROSTRUCTURE SEMICONDUCTOR SWITCH AND FABRICATION THEREOF

(75) Inventors: Yean-Kuen Fang; Kuen-Hsien Wu; Tzer-Jing Chen, all of Tainan (TW)

(73) Assignee: National Science Council, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/119,998

(22) Filed: Jul. 21, 1998

(51) Int. Cl.[7] ............................................. H01L 31/0312
(52) U.S. Cl. ..................................... 257/77; 257/191
(58) Field of Search ............................. 257/77, 190, 191

(56) References Cited

U.S. PATENT DOCUMENTS 5,670,414 * 9/1997 Fang et al. ............................ 437/100
6,077,760 * 6/2000 Fang et al. ............................ 438/492

* cited by examiner

Primary Examiner—Sara Crane
(74) Attorney, Agent, or Firm—Jackson Walker L.L.P.

(57) ABSTRACT

This invention is a novel silicon carbide and silicon (SiC/Si) heterostructure N-shaped negative-differential-resistance semiconductor switch having low power dissipation and large on/off current ratio. The structure of the semiconductor switch includes Al electrode/p-type single crystal silicon carbide layer/graded-composition layer/n-type single crystal silicon substrate/Al electrode (Al/p-SiC/GCL/n-Si/Al), wherein the graded-composition layer is a buffer layer between the p-SiC and n-Si layers.

5 Claims, 4 Drawing Sheets

SIC/SI HETEROSTRUCTURE SEMICONDUCTOR SWITCH AND FABRICATION THEREOF

FIELD OF THE INVENTION

The present invention is related to a SiC/Si heterostructure negative-differential-resistance (NDR) diode, and in particular related to a SiC/Si heterostructure semiconductor switch.

BACKGROUND OF THE INVENTION

In addition to be applied for logic, memory and functional device circuits, the N-shaped negative-differential-resistance (NDR) device has been used as a special-application switch. To offer an effective switching action, a switch should have two stable operating states, the high-current, low-voltage "on-state" and the low-current, high-voltage "off-state"). The switch with these two stable operating states will have low off-state power dissipation, and a large on/off current ratio. Such performance can only be achieved from a low-impedance on-state and a high-impedance off-state. In general, a S-shaped NDR device is more suitable for use as a semiconductor switch in view of its low on-state impedance and high off-state impedance. However, most of the S-shaped NDR devices are of a PNPN multi-layer structure, and thus the fabrication process thereof is complicated and difficult.

For most conventional N-shaped NDR devices, such as tunneling diode and resonant tunneling diode, the off-state impedance is small. Hence, when acting as switches, they will suffer a low on/off current ratio and high power loss at the off-state due to a large off-state current. The on/off current ratio is determined by the peak-to-valley current ratio (PVCR) which is not high for most conventional N-shaped NDR devices. Therefore, the switching action is not obvious when the conventional N-shaped NDR devices are used as a switch. In addition, the selections of bias and load of the switches are restricted in a great extent. In order to enhance the PVCR, some N-shaped NDR devices were modified to have more complicated structures, for examples δ-doping layers, double quantum wells, tunneling devices and integrated transistors. However, these modified structures require more sophisticated fabrication techniques and thus increase the difficulty of fabrication.

The main objective of the present invention is to provide a N-shaped NDR semiconductor switch having a simple structure which is easy to be made, and an excellent switching performance similar to the S-shaped NDR semiconductor switch. More specifically, the N-shaped NDR semiconductor switch of the present invention will be devoid of the following drawbacks of the prior art:

1. the high off-state power dissipation and low on/off current ratio of the conventional N-shaped NDR semiconductor switch;
2. the complicated structures of the conventional N-shaped NDR semiconductor switch and the conventional S-shaped NDR semiconductor switch, and the difficult fabrication processes thereof; and
3. the relatively high price of the conventional N-shaped NDR semiconductor switch and the incompatibility with the fabrication processes of Si integrated circuits resulting from its III-V structure, and the problem of not able to work at high temperature (>100° C.).

SUMMARY OF THE INVENTION

In order to accomplish the objectives of the present invention a SiC/Si heterostructure semiconductor switch constructed according to the present invention comprises a single crystal silicon (Si) layer, a silicon carbide (SiC) layer and a graded-composition layer between the Si layer and the SiC layer. The graded-composition layer contains Si and C, wherein Si/C molar ratio decreases with increasing distance from the Si layer. The Si layer may be doped with impurities of the first conductive type, preferably n-type impurities, and the SiC layer may be doped with impurities of the second conductive type, preferably p-type impurities.

The semiconductor switch of the present invention may further comprise a first electrode formed on a surface of the Si layer which is opposite to and away from the graded-composition layer, and a second electrode formed on a surface of the SiC layer which is opposite to and away from the graded-composition layer.

Preferably, the graded-composition layer has a thickness of 2000–3000 Å.

Preferably, the SiC layer has a thickness of 5000–7000 Å.

A method for preparing the SiC/Si heterostructure semiconductor switch of the present invention is also disclosed, which comprises the following steps:

a) removing a native oxide on a single crystal silicon (Si) substrate doped with impurities of a first conductive type;

b) forming a graded-composition layer on a surface of the Si substrate from the step a) in a reaction chamber by chemical vapor deposition, wherein a fixed flow rate of silane gas is introduced into the reaction chamber and a gradually increasing flow rate of alkane gas is introduced into the reaction chamber during the chemical vapor deposition, wherein the flow rate of the alkane gas is zero when the chemical vapor deposition is initiated; and c) forming a silicon carbide (SiC) layer doped with impurities of a second conductive type on the graded-composition layer.

Preferably, the method of the present invention further comprises a step of cleaning the single crystal silicon (Si) substrate doped with the first conductive type impurities prior to the step a).

Preferably, in the step a) the single crystal silicon (Si) substrate doped with the first conductive type impurities is placed in a mixture of HCl and $H_2$ at 2.5 torr and 900° C. for a period of time to remove the native oxide.

Preferably, the silane gas is $SiH_4$ and the alkane gas is $C_3H_8$ in the step b).

Preferably, $SiH_4$ as the silane gas is introduced into the reaction chamber at 12 sccm and $C_3H_8$ as the alkane gas is introduced into the reaction chamber with a gradually varied flow rate from 0 to 10 sccm during the chemical vapor deposition in the step b), wherein the reaction chamber is maintained at 1200° C. and 2.5 torr with an additional $H_2$ stream being introduced into the reaction chamber.

Preferably, in the step c) the silicon carbide (SiC) layer doped with the second conductive type impurities is formed on the graded-composition layer in a reaction chamber which is maintained at 1200° C. and 2.5 torr, wherein a $C_3H_8$ stream, a $B_2H_6$ stream, a $SiH_4$ stream and a $H_2$ stream are introduced into the reaction chamber at flow rates of 10 sccm, 12 sccm, 12 sccm and 1.2 lpm (liter per minute) respectively.

Preferably, the method of the present invention further comprises steps of forming a first electrode on a surface of the Si substrate which is opposite to and away from the graded-composition layer; and forming a second electrode formed on a surface of the SiC layer which is opposite to and away from the graded-composition layer after the step c).

DETAILED DESCRIPTION OF THE INVENTION

Figure 1:
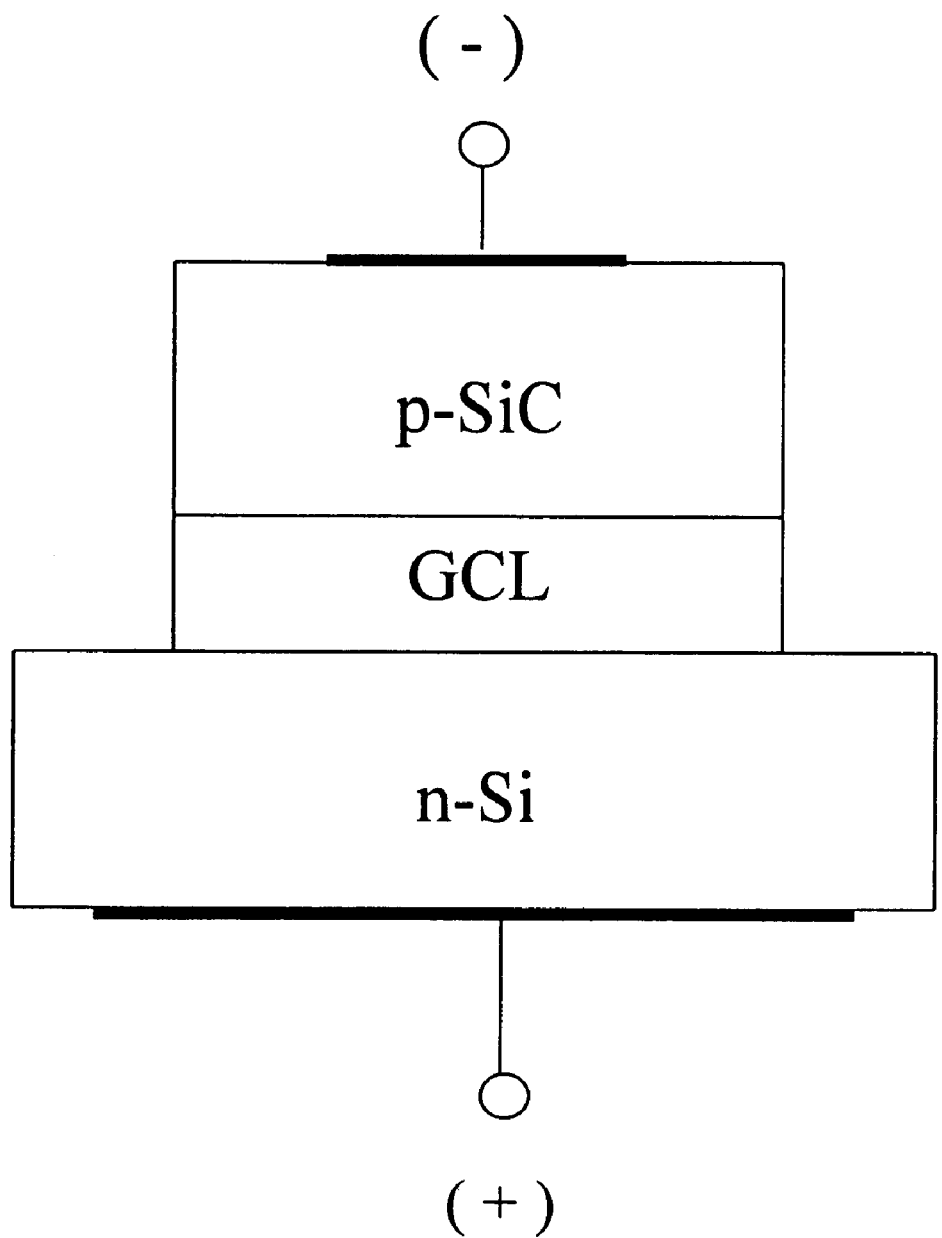
FIG. 1 shows a schematic cross-sectional view of a Al/p-SiC/GCL/n-Si/Al heterostructure N-shaped negative differential resistance (NDR) semiconductor switch according to one of the preferred embodiments of the present invention.

The present invention discloses a novel semiconductor switch made from a SiC/Si heterostructure N-shaped negative-differential-resistance (NDR) device with a special current-voltage (I-V) characteristic containing a low-impedance region, a negative-differential-resistance region, and a high-impedance region not seen in the conventional N-shaped NDR devices. Therefore, the semiconductor switch of the present invention can have two stable operating states of high on-/off-state current ration after an appropriate bias and load are applied to the semiconductor switch, and thus obtain a more effective switching action. Further, the semiconductor switch of the present invention has a low on-state impedance, i.e. a high-current and low-voltage on-state, and a high off-state impedance, i.e. a low-current and a high-voltage off-state, so that the semiconductor switch of the present invention has a lower power dissipation at the off-state in comparison with the conventional N-shaped NDR switch.

The SiC/Si heterostructure N-shaped negative-differential-resistance (NDR) device of the present invention is easy to be made by mainly carrying out a graded-composition deposition on a silicon substrate. Moreover, the SiC/Si heterostructure N-shaped negative-differential-resistance (NDR) switch of the present invention is composed essentially of a high energy gap SiC material, and the NDR's thereof can even be obtained at a temperature up to 300° C. after testing, indicating the developed semiconductor switch is potential for high-temperature applications.

EXAMPLE

A SiC/Si heterostructure N-shaped negative-differential-resistance (NDR) switch according to one of the preferred embodiments of the present invention was prepared by the following steps:

1. A (111) n-type Si substrate with an average resistivity of 0.08 Ω-cm (carrier concentration is about $10^{17}$ cm$^{-3}$) was cleaned by standard cleaning procedures prior to placing into a reaction chamber of a RTCVD system. The reaction chamber was vacuumed to $10^{-6}$ torr and then heated to 900° C., followed by continuously introducing HCl (10 sccm) and $H_2$ (1.2 lpm) for a period of 10 minutes so that a native oxide on the Si substrate was removed, wherein the pressure of the reaction chamber was maintained at 2.5 torr. The reaction chamber was then cooled to room temperature and then vacuumed to $10^{-6}$ torr.

2. $SiH_4$ (12 sccm) and $H_2$ (1.2 lpm) were continuously introduced into the reaction chamber while heating the reaction chamber to a temperature of 1200° C. (25° C./minute), and then $C_3H_8$ was fed to the reaction chamber with a flow rate gradually increasing from 0 to 10 sccm in 5 minutes for the deposition of a graded-composition layer (GCL) having a thickness about 2250 Å, wherein the pressure of the reaction chamber was maintained at about 2.5 torr by an automatic pressure controller (APC).

3. A p-type silicon carbide (p-SiC) layer having a thickness about 5500 Å was grown under the following conditions: 10 sccm $C_3H_8$, 12 sccm $SiH_4$, 1.2 lpm $H_2$, 2.5 torr, 1200° C., and growing time 10 minutes.

4. Al was evaporated on the p-SiC with an area of 9.1 mm$^2$ and annealed at 700° C. for 30 seconds to form the ohmic contact.

5. Finally, Al was also evaporated on the back side of the n-Si substrate for the electrode contact.

The SiC/Si heterostructure N-shaped negative-differential-resistance (NDR) switch prepared according to the above steps contains Al/p-SiC/GCL/n-Si/Al layers from the top to the bottom, as shown in FIG. 1, in which the GCL layer (graded-composition layer) is a buffer-layer between the p-SiC (p-type silicon carbide) layer and the n-Si (n-type silicon) substrate.

Figure 2:
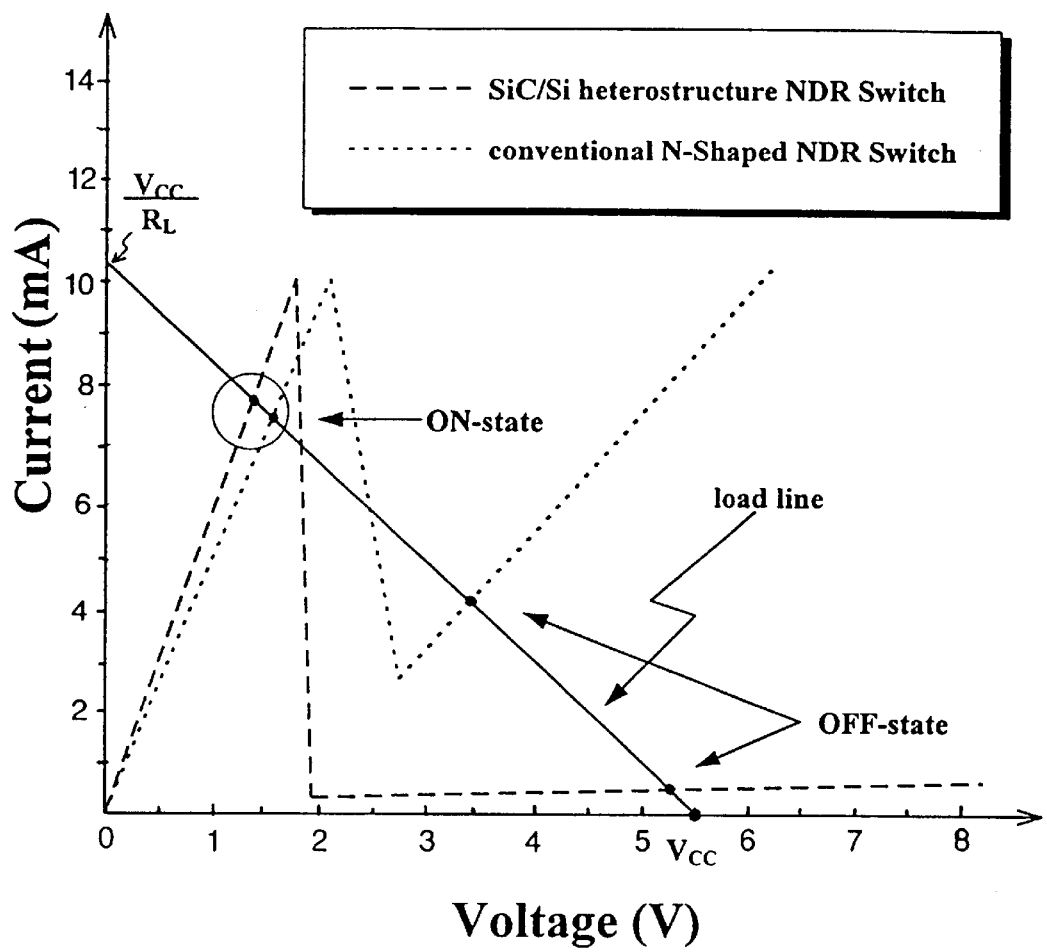
FIG. 2 is a I-V characteristics plot which shows comparisons of the On and Off states between an effective switching device with an ideal N-shaped NDR and the conventional N-shaped NDR devices, wherein the dot line . . . and the broken line - - - represent the I-V characteristics of the ideal N-shaped NDR and the conventional N-shaped NDR devices respectively, and the solid line is a load line.

As shown in FIG. 2, an ideal N-shaped NDR switch should have a high-impedance off-state to improve the defects of low-impedance off-state, high power loss at the off-state and a low on/off current ratio of the conventional N-shaped NDR switches (S. Wang, "High-Speed Semiconductor Devices", New York: Wiley, 1990).

Figure 3A:
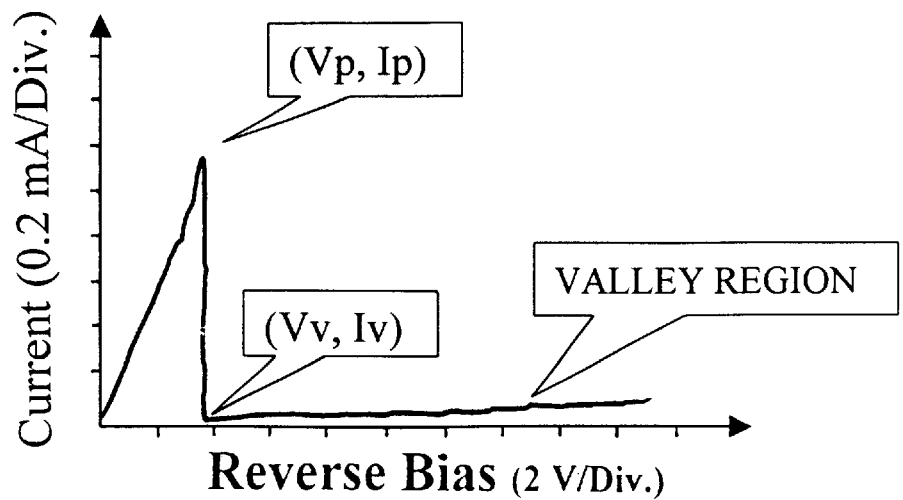
FIG. 3(a) shows the I-V characteristic curve of a SiC/Si heterostructure N-shaped NDR switch according to a preferred embodiment of the present invention.
Figure 3B:
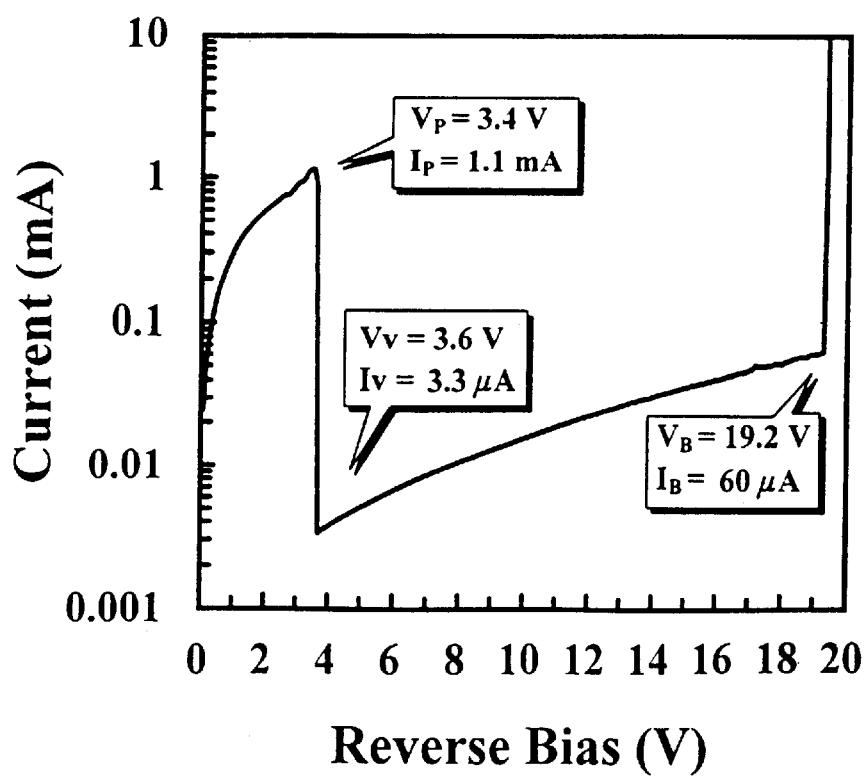
FIG. 3(b) shows a semilog I-V characteristic curve of the SiC/Si heterostructure N-shaped NDR switch shown in FIG. 3(a).

FIGS. 3(a) and 3(b) show the I-V characteristic curve and the semilog I-V characteristic curve of the N-shaped NDR switch prepared by the present invention under reverse biases at room temperature. It can be seen from FIG. 3(a) that the N-shaped NDR switch prepared by the present invention has an obvious N-shaped NDR similar to that of the ideal N-shaped NDR switch shown in FIG. 2, wherein the peak voltage, $V_p$=3.4 V, and the peak current, $I_p$=1.1 mA; the valley voltage, $V_v$=3.6 V, and the valley current, Iv=3.3μA; and the peak-to-valley current ratio, PVCR=330. As shown in FIG. 3(b), the voltage extension of the high-impedance valley region is about 15.6 V, and this large voltage extension greatly increases the flexibility of bias choice for an effective switch. In addition, the resistance values of the high-impedance region and the low impedance region at room temperature (27° C.) of the N-shaped NDR switch prepared by the present invention calculated from FIG. 3(b) are 275 kΩ and 3 kΩ respectively, the former being about 100 times of the latter. Therefore, by a proper bias and a load, two stable operating states with a high on/off current ratio can be obtained to perform an effective switching action.

Figure 4:
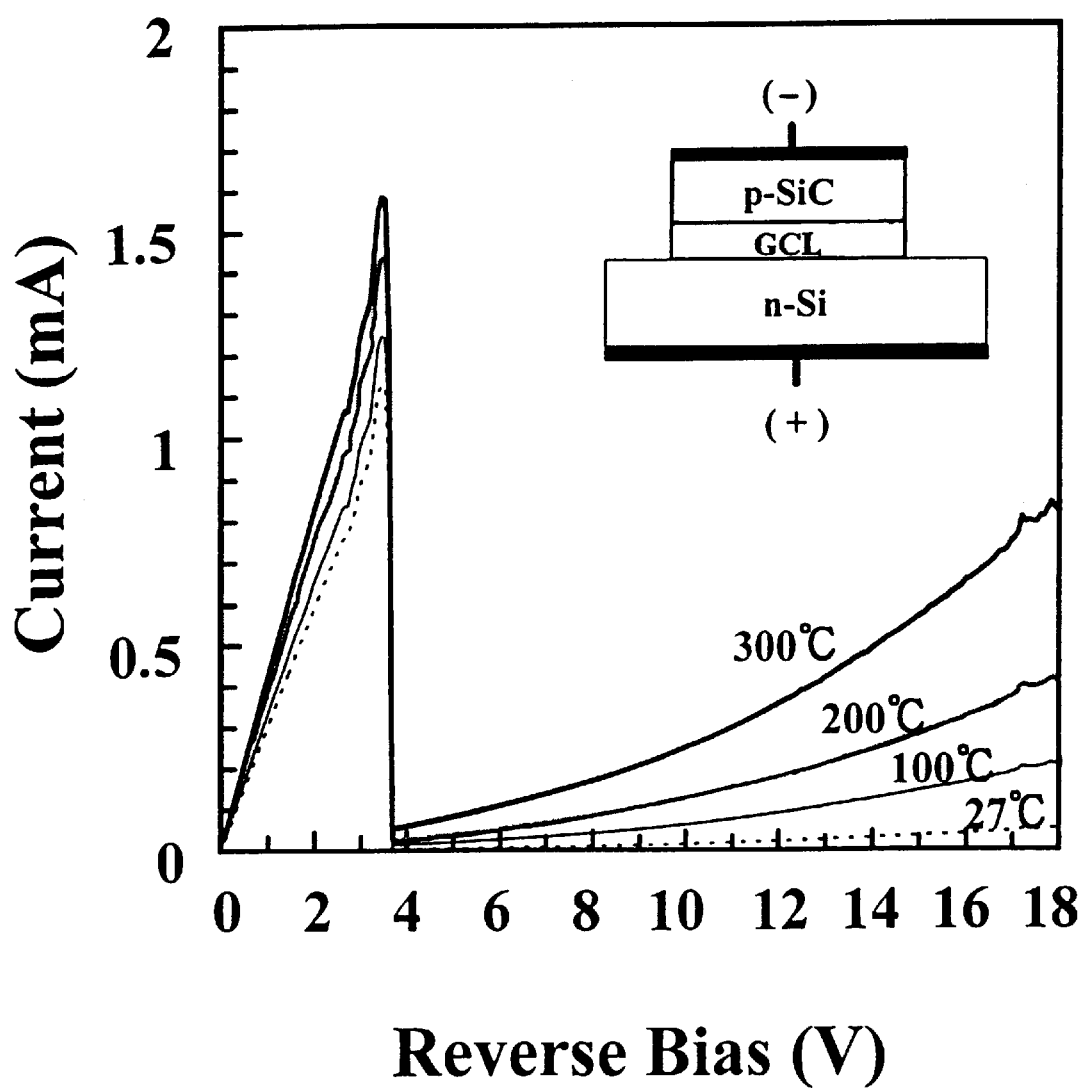
FIG. 4 shows I-V characteristic curves of the SiC/Si heterostructure N-shaped NDR switch shown in FIG. 3(a) measured at different temperatures of 27° C., 100° C., 200° C. and 300° C.

The N-shaped NDR switch prepared by the present invention can even be obtained at temperatures up to 300° C., indicating this novel N-shaped NDR switch is potential for high-temperature application, as shown in FIG. 4.

In conclusion, the SiC/Si heterostructure N-shaped NDR switch of the present invention has the following advantages:

1. Low power dissipation at off-state and high on/off current ratio.
2. The NDR's can be obtained up to 300° C., and is suitable for high-temperature applications.
3. The structure of the SiC/Si heterostructure N-shaped NDR switch of the present invention is very simple and hence is much easily fabricated compared to the conventional NDR switch.
4. The valley region in the I-V characteristics of the SiC/Si heterostructure N-shaped NDR switch of the present invention gets a large voltage extension, which increases the flexibility in biasing the device.
5. The typical peak-to-valley current ratio of the SiC/Si heterostructure N-shaped NDR switch of the present invention is quite large (about 337). Hence, it is easy to obtain a high on/off current ratio.
6. The SiC/Si heterostructure N-shaped NDR switch of the present invention possesses a high peak current, and hence, a high current driving capability.
7. Because the SiC/Si heterostructure N-shaped NDR switch of the present invention is fabricated on a Si substrate, it is compatible to the silicon IC process and is expected to be suitable to applications to Application-Specific Integrated Circuits (Application specific IC, ASIC), or it can be combined with a different type material (for example amorphous silicon) to fabricate a integrated optoelectronic switch.

What is claimed is:

1. A SiC/Si heterostructure semiconductor switch device comprising:

a single crystal silicon (Si) layer, silicon carbide (SiC) layer and a graded-composition layer between said Si layer and said SiC layer;

where said Si layer is doped with n-type impurities;

where said SiC layer is doped with p-type impurites; and where said graded-composition layer has a thickness of 2000–3000 Å.

2. The semiconductor switch according to claim 1 further comprising a first electrode formed on a surface of the Si layer which is opposite to and away from the graded-composition layer, and a second electrode formed on a surface of the SiC layer which is opposite to and away from the graded-composition layer.

3. The semiconductor switch according to claim 1, wherein the SiC layer has a thickness of 5000–7000 Å.

4. The device as recited in claim 2, where said first electrode further comprises aluminum metal.

5. The device as recited in claim 2, where said second electrode further comprises aluminum metal.

* * * * *